United States Patent
Kallioinen et al.

(10) Patent No.: US 10,615,197 B2
(45) Date of Patent: Apr. 7, 2020

(54) QUANTUM DOT PHOTODETECTOR APPARATUS AND ASSOCIATED METHODS

(71) Applicant: Nokia Technologies Oy, Espoo (FI)

(72) Inventors: Sami Kallioinen, Espoo (FI); Martti Voutilainen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 45 days.

(21) Appl. No.: 16/080,236

(22) PCT Filed: Feb. 20, 2017

(86) PCT No.: PCT/FI2017/050108
§ 371 (c)(1),
(2) Date: Aug. 27, 2018

(87) PCT Pub. No.: WO2017/149195
PCT Pub. Date: Sep. 8, 2017

(65) Prior Publication Data
US 2019/0051681 A1    Feb. 14, 2019

(30) Foreign Application Priority Data
Mar. 4, 2016  (EP) .................................... 16158802

(51) Int. Cl.
*H01L 27/14*    (2006.01)
*H01L 27/144*   (2006.01)
(Continued)

(52) U.S. Cl.
CPC ........ *H01L 27/1443* (2013.01); *G01J 1/1626* (2013.01); *G01J 1/42* (2013.01);
(Continued)

(58) Field of Classification Search
CPC ........... H01L 27/1443; H01L 27/14603; H01L 27/1446; H01L 31/113; H01L 31/035218;
(Continued)

(56) References Cited

U.S. PATENT DOCUMENTS 3,340,427 A * 9/1967 Bisso ................. G01N 21/8903
                                              315/155
8,440,997 B2  5/2013 Wang et al.
(Continued)

FOREIGN PATENT DOCUMENTS

| CN | 104701393 A | 6/2015 |
| CN | 104900731 A | 9/2015 |
| EP | 3174108 A1  | 5/2017 |

OTHER PUBLICATIONS

Office action received for corresponding Korean Patent Application No. 2018-7028619, dated Sep. 25, 2019, 6 pages of office action and no pages of office action translation available.
(Continued)

Primary Examiner — Tony Ko
(74) Attorney, Agent, or Firm — Nokia Technologies Oy

(57) ABSTRACT

An apparatus comprising at least one pair of a first inner and second outer photodetector, each photodetector comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member. The first inner and second outer photodetectors are configured to generate electron-hole pairs which produce an increase and decrease in electrical current through the channel members. The first inner and the second outer photodetectors share a common channel member, which is partitioned by one or more of the respective source and drain electrodes respectively extending in two dimensions such that the first inner photodetector is defined within the second outer photodetector.

19 Claims, 9 Drawing Sheets

(51) Int. Cl.
| | |
|---|---|
| *G01J 1/16* | (2006.01) |
| *G01J 1/44* | (2006.01) |
| *H01L 31/0352* | (2006.01) |
| *H01L 31/113* | (2006.01) |
| *G01J 1/42* | (2006.01) |
| *H01L 27/146* | (2006.01) |
| *H01L 31/028* | (2006.01) |

(52) U.S. Cl.
CPC ............ *G01J 1/44* (2013.01); *H01L 27/1446* (2013.01); *H01L 27/14603* (2013.01); *H01L 31/035218* (2013.01); *H01L 31/113* (2013.01); *G01J 2001/4473* (2013.01); *H01L 27/14609* (2013.01); *H01L 31/028* (2013.01)

(58) Field of Classification Search
CPC .... H01L 27/14609; H01L 31/028; G01J 1/42; G01J 1/44; G01J 1/1626; G01J 2001/4473
See application file for complete search history.

(56) References Cited

U.S. PATENT DOCUMENTS

| | | |
|---|---|---|
| 8,441,090 B2 | 5/2013 | Tian et al. |
| 2008/0048560 A1 | 2/2008 | Sung et al. |
| 2013/0032782 A1 | 2/2013 | Gerasimos et al. |
| 2014/0299741 A1 | 10/2014 | Colli |
| 2015/0364545 A1 | 12/2015 | Heo et al. |
| 2016/0005894 A1 | 1/2016 | Zhang et al. |
| 2019/0051786 A1* | 2/2019 | White ............. H01L 31/035218 |

OTHER PUBLICATIONS

Mathieson et al., "Photovoltaic Retinal Prosthesis with High Pixel Density", Nature Photonics, vol. 6, Jun. 2012, pp. 391-397.

"MOSFET as a Switch", Electronics Tutorials, Retrieved on Aug. 20, 2018, Webpage available at : https://www.electronics-tutorials.ws/transistor/tran_7.html.

Xu et al., "Contact Length Scaling in Graphene Field-Effect Transistors", Applied Physics Letters, vol. 100, No. 10, Mar. 5, 2012, pp. 1-4.

Extended European Search Report received for corresponding European Patent Application No. 16158802.5, dated Sep. 16, 2016, 8 pages.

Klekachev et al., "Graphene Transistors and Photodetectors", The Electrochemical Society Interface, vol. 22, No. 1, 2013, pp. 63-68.

Zhan et al., "Graphene Field-Effect Transistor and Its Application for Electronic Sensing", Small, vol. 10, No. 20, Oct. 29, 2014, pp. 1-24.

International Search Report and Written Opinion received for corresponding Patent Cooperation Treaty Application No. PCT/FI2017/050108, dated May 4, 2017, 14 pages.

* cited by examiner

702 — 1024 columns and GFET pair powering regulators 1024 rows and amplifiers

Signal ground

1000 — Determining one or more of the presence and magnitude of electromagnetic radiation incident upon the apparatus based on the combined change in electrical current of the pair of first inner and second outer photodetectors as a result of the incident electromagnetic radiation.

Figure 11

1100 — Configuring the apparatus such that the first inner photodetector and second outer photodetector of the photodetector pair generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation.

Figure 12

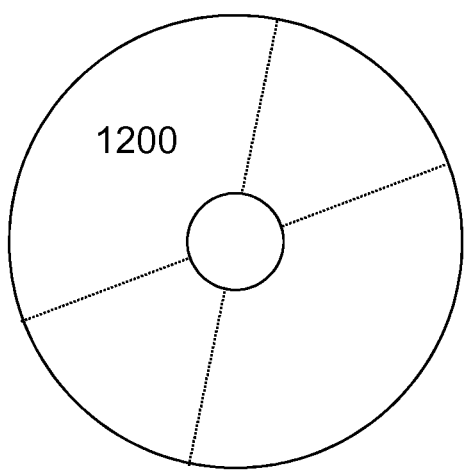

QUANTUM DOT PHOTODETECTOR APPARATUS AND ASSOCIATED METHODS

RELATED APPLICATION

This application was originally filed as PCT Application No. PCT/FI2017/050108 filed Feb. 20, 2017 which claims priority benefit from EP Patent Application No. 16158802.5. filed Mar. 4, 2016.

TECHNICAL FIELD

The present disclosure relates particularly to photodetectors, associated methods and apparatus. Certain examples relate to light detection, such as X-ray and visible light detection. Certain examples specifically concern an apparatus comprising at least one pair of first and second photodetectors each having a plurality of quantum dots configured to generate electron-hole pairs on exposure to incident electromagnetic radiation. Some examples may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed examples may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new photodetector devices.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising at least one pair of a first inner photodetector and a second outer photodetector,
  each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;
  the first inner photodetector and second outer photodetector of the photodetector pair configured to generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation;
  the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector.

The respective partitioning electrodes may be configured such that:
  the drain electrode of the first inner photodetector acts as the source electrode of the second outer photodetector; or
  the drain electrode of the first inner photodetector is electrically connected to the source electrode of the second outer photodetector.

Two or more of the source and drain electrodes of the first inner photodetector and the second outer photodetector may be substantially concentric.

The common channel member partition associated with the first inner photodetector may be coplanar with the common channel member partition associated with the second outer photodetector.

The first inner photodetector and second outer photodetector may be coplanar. For example, the source and drain electrodes together with the channel member may be considered to be coplanar.

The common channel member may comprise one or more of a two-dimensional material, graphene, a graphene-like material (e.g., graphene oxide, phosphorene, silicene, germanene, stanene, h-BN, AlN, GaN, InN, InP, InAs, BP, BAs and GaP) and a transition metal dichalcogenide (e.g., $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$, $PtX_2$, where X=S, Se or Te.). The common channel member may comprise membranes/foils of nanometre thick carbon structures.

The first inner photodetector may comprise an inner source electrode configured to provide a connection to a power supply. The power supply, when connected, may be configure to power the first inner photodetector and second outer photodetector.

The inner source electrode may be located substantially centrally within the first inner photodetector. The first inner photodetector may be located substantially centrally within the second outer photodetector. In other embodiments, it could be non-centrally positioned (positioned off-centre).

The second outer photodetector may comprise a drain electrode located around the periphery of the second outer photodetector in two dimensions. The drain electrode of the second outer photodetector may be configured to provide a connection between the second outer photodetector and ground.

The first inner photodetector and second outer photodetector may each comprise a gate electrode configured to generate an electric field upon the application of a voltage thereto. The generated electric field may enable the transfer of either electrons or holes to the channel member partition of the corresponding photodetector, thereby allowing for the conductivity of the corresponding photodetector to be regulated.

The first inner photodetector and second outer photodetector of the photodetector pair may comprise similarly doped channel members. The voltage applied to the gate electrode of the first inner photodetector may have an opposite polarity to the voltage applied to the gate electrode of the second outer photodetector such that the resulting electric fields enable the transfer of different types of charge carrier to the respective channel members in order to produce different changes in electrical current.

The first inner photodetector and second outer photodetector of the photodetector pair may comprise oppositely doped channel members. The voltage applied to the gate electrode of the first inner photodetector may have the same polarity as the voltage applied to the gate electrode of the second outer photodetector such that the resulting electric fields enable the transfer of the same type of charge carrier to the respective channel members in order to produce the different changes in electrical current.

The first inner photodetector and second outer photodetector of the photodetector pair may be arranged such that the combined change in electrical current is converted into a corresponding voltage signal.

The first inner photodetector and second outer photodetector of the photodetector pair may be arranged to form a half-bridge circuit configured to convert the combined change in electrical current into a single-ended voltage signal.

The apparatus may comprise at least two pairs of first inner photodetector and second outer photodetector arranged to form a full-bridge circuit configured to convert the combined change in electrical current into a differential voltage signal.

The apparatus may comprise at least a first pair of a first inner photodetector and a second outer photodetector and a second pair of a first inner photodetector and a second outer photodetector, the first pair being adjacent to the second pair; wherein:
  the first inner photodetector of the first pair is configured to produce an increase in electrical current through its channel member partition;
  the second outer photodetector of the first pair is configured to produce an decrease in electrical current through its channel member partition;
  the first inner photodetector of the second pair is configured to produce an decrease in electrical current through its channel member partition; and
  the second outer photodetector of the second pair is configured to produce an increase in electrical current through its channel member partition.

In a further aspect there is provided a plurality of apparatus as described herein, each apparatus comprising at least one pair of a first inner photodetector and a second outer photodetector,
  each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;
  the first inner photodetector and second outer photodetector of the photodetector pair configured to generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation;
  the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector;
  each apparatus of the plurality comprising a drain electrode located around the periphery of the second outer photodetector in two dimensions, the respective drain electrodes of the plurality being in electrical contact with each other and configured to provide a connection to ground for the plurality of apparatus.

The first inner photodetector and second outer photodetector may together form a pixel. The pixel shape may be: square, rectangular, triangular, or hexagonal.

Corners of one or more of: the drain electrode of the first inner photodetector, the source electrode of the first inner photodetector and the drain electrode of the second outer photodetector and the source electrode of the second outer photodetector may be rounded to facilitate current flow in the one or more respective electrodes.

One or more of the material, size and shape of the quantum dots may be configured such that the electron-hole pairs are generated on exposure to at least one of the following types of electromagnetic radiation: x-rays, visible light, infrared, ultraviolet, radio waves, microwaves, gamma rays and thermal radiation.

The quantum dots may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

The source, drain and/or gate electrodes may comprise one or more of a metal, a metal nanoparticle ink, silver, gold, copper, nickel, cobalt, palladium, a conductive metal oxide, a carbon-based material, an organic material and a polymer.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an electromagnetic radiation sensor, an x-ray sensor, and a module for one or more of the same.

According to a further aspect, there is provided a method of using an apparatus,
  the apparatus comprising at least one pair of a first inner photodetector and a second outer photodetector,
  each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;
  the first inner photodetector and second outer photodetector of the photodetector pair configured to generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation;

the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector;

the method comprising determining one or more of the presence and magnitude of electromagnetic radiation incident upon the apparatus based on the combined change in electrical current of the pair of first inner and second outer photodetectors as a result of the incident electromagnetic radiation.

According to a further aspect, there is provided a method of making an apparatus, the apparatus comprising at least one pair of a first inner photodetector and a second outer photodetector, each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;

the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector;

the method comprising configuring the apparatus such that the first inner photodetector and second outer photodetector of the photodetector pair generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation.

The steps of any method disclosed herein do not have to be performed in the exact order disclosed, unless explicitly stated or understood by the skilled person.

In a further aspect there is provided a computer program comprising computer code configured to perform any method claimed or described herein. Corresponding computer programs for implementing one or more steps of the methods disclosed herein are also within the present disclosure and are encompassed by one or more of the described examples.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, examples or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:

FIG. 11 shows a method of making the present apparatus; and

FIG. 12 shows a computer-readable medium comprising a computer program configured to perform, control or enable a method described herein.

DESCRIPTION OF SPECIFIC ASPECTS/EXAMPLES

Certain examples described herein relate to oppositely biased photodetectors, such as quantum dot graphene field effect transistors (QD-GFETs). Such detectors may be used in large-area detector arrays. Certain examples described herein provide detector geometries which may provide certain advantages as described below.

Light detector arrays, for example arrays comprising photodetectors (e.g. QD GFETs) may be used in different applications such as teraherz radio waves, infrared light, visible light, ultraviolet light and X-ray imaging.

It may be desirable to minimise the amount of patterning required of the graphene (or other channel layer material used for the apparatus). Patterning is an additional process phase, and areas of the light detection array where graphene/channel layer material has been removed are areas which are not configured to function as light detectors, thus reducing the possible effective sensor area of the pixel array. Further, patterning a graphene/channel layer foil on the scale of individual pixels may be very technically challenging and time consuming. It may thus be desirable to be able to use a single graphene/channel layer foil over an array of several pixels so that electrodes of different pixels will not be connected electrically by the graphene/channel layer foil.

It may be desirable for the pixels in the light detector array to have a geometry which allows for easier manufacturing. For example, if QD GFETs are used as the light detecting apparatus, it may be advantageous to manufacture an array of several such apparatus in such a way as to reduce the handling of graphene used in the array manufacture. Reducing the manipulation of graphene can help maintain the desirable electrical and other properties of graphene by reducing the chance of forming any rips, tears, stretches or folds of the graphene.

Figure 1:
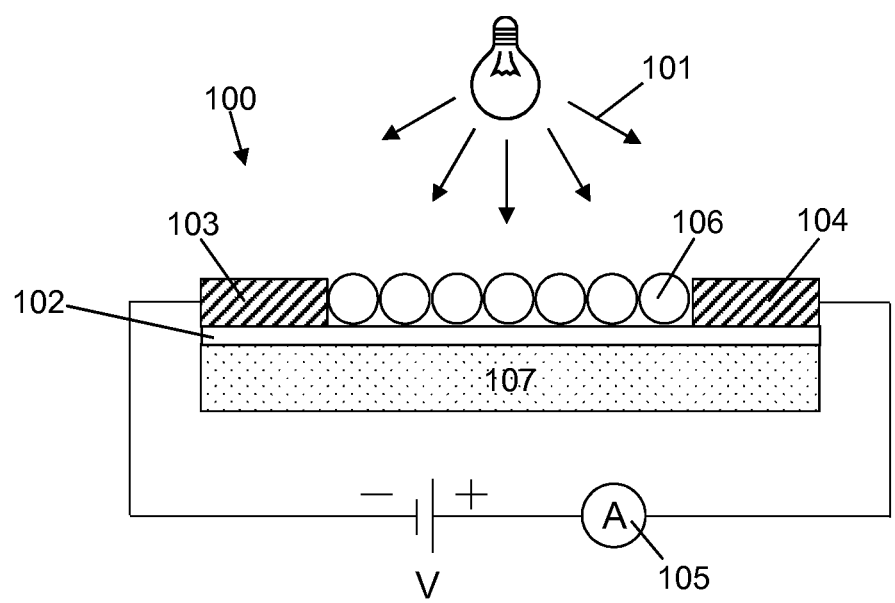
FIG. 1 shows a photodetector comprising a quantum dot field effect transistor according to examples described herein.

FIG. 1 shows (in a thickness plane/in cross-section) a photodetector 100 comprising a photosensitive material 106 (in this example, comprising quantum dots) on top of a channel member 102 (which itself is supported on a substrate 107). The photodetector 100 in this example also comprises a power supply configured to apply a potential difference V between the source 103 and drain 104 electrodes, and an ammeter 105 configured to measure the electrical current flowing through the channel member 102. The source 103 and drain 104 electrodes are configured to enable a flow of electrical current through the channel member 102 between the source 103 and drain 104 electrodes. The plurality of quantum dots 106 are configured to generate electron-hole pairs on exposure to the incident electromagnetic radiation 101 to produce a detectable change in the electrical current flowing through the channel member 102.

Figure 2:
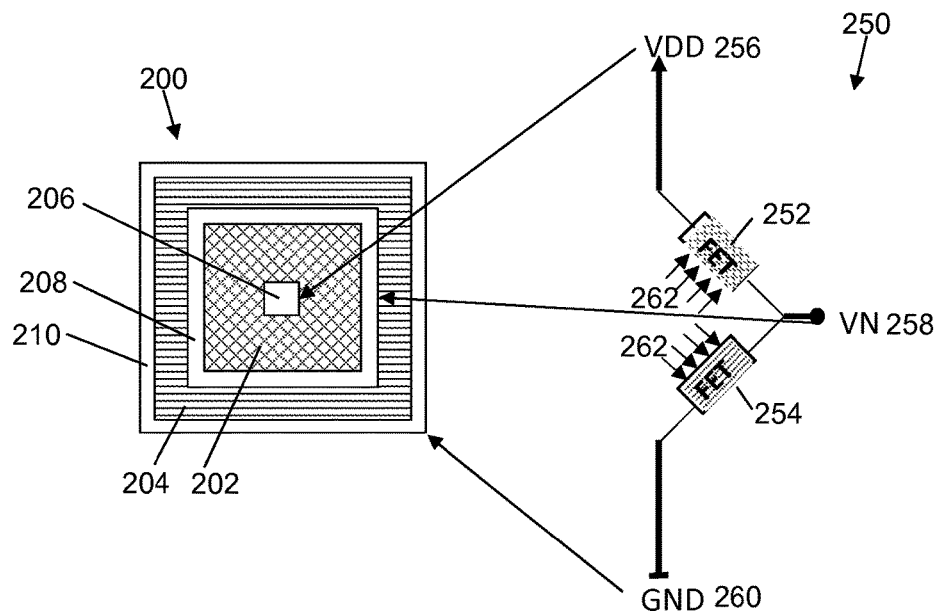
FIG. 2 shows one example of the present apparatus and a representation as a half-bridge circuit.

FIG. 2 shows one example of the present apparatus 200 in which the apparatus 200 comprises a first inner photodetector 202 and second outer photodetector 204 in a photodetector pair. The apparatus 200 may be termed a pixel. The first inner photodetector 202 and second outer photodetector 204 are configured to generate electron-hole pairs which produce an increase and decrease in electrical current through the channel members respectively. The combined change in electrical current of the pair of first inner photodetector 202 and second outer photodetector 204 is indicative of one or more of the presence and magnitude of the incident electromagnetic radiation. Since the first inner photodetector 202 exhibits an opposite optoelectronic response to the second outer photodetector 204, the output signal of the apparatus 200 can be up to twice as large as a similar photodetector which is not used with an oppositely biased photodetector.

The pair of first inner and second outer photodetectors 202, 204 may be called opposite-biased photodetectors, or an opposite-biased photodetector pair, since one of the pair 202, 204 is configured to produce an increase in electrical current through the channel member and the other of the pair 202, 204 is configured to produce a decrease in electrical current through the channel member.

The apparatus of FIG. 2 may be represented as a half-bridge circuit 250 as shown on the right of FIG. 2 with the first inner photodetector 202 shown as the FET 252 circuit component, and the second outer photodetector 204 shown as the FET 254 circuit component. Light (e.g., visible light, UV light or X-ray radiation) 262 shines onto the first inner and second outer photodetectors 252, 254 and a signal can be read out from VN 258 to indicate the presence and/or magnitude of the detected light 262. Thus the first inner photodetector 202 and second outer photodetector 204 of the photodetector pair 200 are arranged to form a half-bridge circuit 250 configured to convert the combined change in electrical current due to exposure to electromagnetic radiation 262 into a single-ended voltage signal VN 258.

In one example the first inner photodetector 202 may be a positively biased photodetector, for example, due to a positive back gate voltage being supplied to the first inner photodetector 202, and the second outer photodetector 204 may be a negatively biased photodetector, for example, due to a negative back gate voltage being supplied to the second outer photodetector 204. (Of course in other examples the first inner photodetector 202 may be negatively biased and the second outer photodetector 204 may be positively biased).

The apparatus 200 in this example comprises an inner electrode 206, and intermediate electrode 208 and an outer electrode 210. The inner electrode 206 is the source electrode for the first inner photodetector 202; the intermediate electrode 208 is both the drain electrode for the first inner photodetector 202 and the source electrode for the second inner photodetector 202; and the outer electrode 208 is the drain electrode for the second outer photodetector 204.

Throughout this specification, the terms "source electrode" and "drain electrode" are used to denote electrodes at opposing sides of a channel layer portion/partition between which charge can flow. In some examples, for example where the photodetectors 202, 204 are quantum-dot graphene field effect transistors (QD GFETs), such devices may be described as ambipolar. The charge carriers in such an apparatus may be electrons or holes depending on, for example, back gating or chemical doping of the channel layer, and the types of charge carriers can change in use depending on how the apparatus is being used. In some examples it may be taken that the electrode labelled as the source electrode is at a lower voltage than the electrode labelled as the drain electrode.

Thus the electrodes 206, 208, 210 of apparatus 200 could equally well be described by saying that the inner electrode 206 is the drain electrode for the first inner photodetector 202; the intermediate electrode 208 is both the source electrode for the first inner photodetector 202 and the drain electrode for the second inner photodetector 202; and the outer electrode 208 is the source electrode for the second outer photodetector 204.

In this example, the first inner photodetector 202 comprises an inner source electrode 206 configured to provide a connection to a power supply. A power supply, when connected, may power the first inner photodetector 202 and second outer photodetector 204. The inner electrode 206 is shown as providing a connection to a power supply as the connection to VDD 256 in the half bridge circuit 250 equivalent. In this example, the inner source electrode 206 is located substantially centrally within the first inner photodetector 202, but in other examples the first inner electrode may be located off-centre within the first inner photodetector 202.

The pixel geometry in this example allows for power to be connected using the VDD connection only to those pixels in a pixel array which are to be read out. For example, one column of pixels may be connected to VDD and read out simultaneously. It is possible to, for example, power all pixel columns in the array sequentially to read out all pixels but only have those pixels which are being read out consume power. In other examples depending on the electrical interconnections used between pixels, any other pixel group (e.g, a row, an n×n grid) or a single pixel may be powered and read out individually.

In this example, the second outer photodetector 204 comprises an outer drain electrode 210 located around the periphery of the second outer photodetector 204. The outer drain electrode 210 of the second outer photodetector 204 is configured to provide a connection between the second outer photodetector 204 and ground. The outer electrode 210 is shown as providing a connection to ground GND 260 in the half bridge circuit 250 equivalent. In examples where a plurality of pixels 200 are arranged in an array the respective outer electrodes 210 of some or all of the pixels 200 in the plurality may be electrically connected to provide a common connection to ground for the pixel array. Many such pixels 200 may be arranged together in this way. By requiring only a single ground connection for an array of possibly hundreds or thousands of individual pixels in an array may greatly simplify system design and manufacture.

In this example, the intermediate electrode 208 acts as a partitioning electrode 208 to separate the common channel layer which overlies the whole apparatus 200 into a first inner photodetector channel layer partition of the first inner photodetector 202, and a second outer photodetector channel layer of the second outer photodetector 204. The partitioning electrode 208 is shown as providing a connection to allow for a signal to be read out via terminal VN 258 in the half bridge circuit 250 equivalent. The signal read out 258 may in some examples be obtained using a switch and voltage amplifier (not shown).

For the overlying common channel layer to provide sufficiently good electrical contact with the partitioning electrode 208 that the common channel layer is partitioned into a first inner photodetector channel partition and a second outer photodetector partition, an electrode/contact width of at least 200 nm in contact with the common channel layer may be required. Increasing the electrode/contact width may be possible as the contact resistance may lower only negligibly with increasing electrode/contact width.

By using a common channel layer which is partitioned by the intermediate electrode 208, a single common channel layer may be used over an array of pixels. This may improve manufacture of pixel arrays because the overlaying common channel layer need not be patterned to partition it into individual photodetector areas. Considering that each photodetector may be very small (for example, from 4 micrometre up to 1 mm across) patterning an overlying channel layer for an array of several of (for example, hundreds, thousands, or more) pixels may be impractical for industrial application, and possibly impractical on a smaller-scale e.g. research-based scale.

The intermediate/partitioning electrode 208 in this example comprises the drain electrode of the first inner photodetector 202 which is also acting as the source electrode of the second outer photodetector 204. The first inner photodetector 202 and the second outer photodetector 204 share a common channel member (which can be imagined in FIG. 2 as comprising a channel layer overlying the electrodes 206, 208, 210 and the spaces in-between which is partitioned by the intermediate electrode 208). The intermediate electrode 208 is acting as a partitioning electrode by extending in two dimensions such that the first inner photodetector 202 is defined within the second outer photodetector 204. It will be appreciated that this two dimensional extension is in a non-thickness plane/a surface plane i.e. plan view/top-down view. It may be thought of as the two dimensional extension being in the same plane as the common channel member.

In other words, the overlying common channel layer does not form a conduction channel between pixels 200, or between the photodetectors of one pair of oppositely biased photodetectors 202, 204 in a pixel as shown in FIG. 2. The common channel layer forms a conduction channel between the inner electrode 206 and the intermediate partitioning electrode 208; and also forms a separate conduction channel between the intermediate partitioning electrode 208 and the outer electrode 210. The two photodetectors 202, 204, may be considered to be functionally independent. Considering a pair of oppositely biased photodetectors 202, 204 configured as shown in FIG. 2 to be a pixel 200, with each of the two photodetectors 202, 204, providing a half-pixel, it may be said that the common channel layer forms a separate conduction channel for each half-pixel 202, 204 of the pair.

In other examples the drain electrode of the first inner photodetector 202 may be a separate electrode to the source electrode of the second outer photodetector 204, and the two electrodes may be electrically connected and act as a partitioning electrode member. For example, the drain electrode of the first inner photodetector 202 may be within the outer lying source electrode of the second outer photodetector 204 and the two electrodes may be connected by one or more conductive bridge(s) or using one or more vias, for example (not shown).

Figure 3:
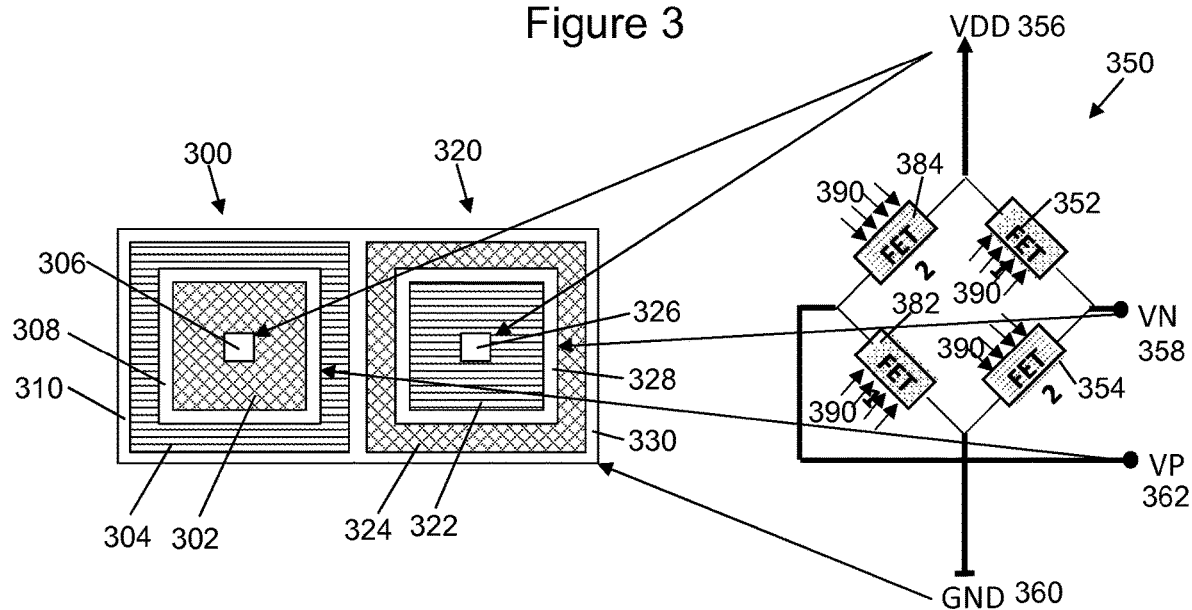
FIG. 3 shows one example of the present apparatus and a representation as a full-bridge circuit.

Whereas FIG. 2 illustrates a half-bridge circuit 250, two pixels 200 together may form a full-bridge circuit 350 as shown in FIG. 3. Using a full-bridge configuration can provide a differential output signal which may help to eliminate many signal disturbances, such as those arising from the supply voltage and external disturbances.

In FIG. 3, two pixels 300, 320 are arranged together in a pixel pair such that their respective outer electrodes 310, 330 are in electrical connection and form a common connection to ground for the pixel pair. FIG. 3 shows a plurality of apparatus 300, 320 in which each apparatus 300, 320 of the plurality comprises a drain electrode 310, 330 located around the periphery of the second outer photodetector 304, 324 of each apparatus 300, 320; the respective drain electrodes 310, 330 of the plurality 300, 320 being in electrical contact with each other and configured to provide a connection to ground 360 for the plurality of apparatus 300, 320.

The first inner photodetector 302 of the first pixel 300 is shown as a FET 352 in the circuit equivalent 350; the second outer photodetector 304 of the first pixel 300 is shown as a FET 354; the first inner photodetector 322 of the second pixel 320 is shown as a FET 382 and the second outer photodetector 324 of the second pixel 320 is shown as a FET 354. In one example the first inner photodetector 302 of the first pixel 300 and the second outer photodetector 324 of the second pixel 320 may each be positively biased due for example to positive back gate voltages being supplied thereto; and the first inner photodetector 322 of the second pixel 320 and the second outer photodetector 304 of the first pixel 300 may each be negatively biased due for example to negative back gate voltages being supplied thereto. (Of course the photodetectors 302, 304, 322, 324 may all be biased in the opposite sense in other examples.)

In other words, FIG. 3 may be understood to illustrate the example of at least a first pair 300 of a first inner photodetector 302 and a second outer photodetector 304 and a second pair 320 of a first inner photodetector 322 and a second outer photodetector 324, the first pair 300 being adjacent to the second pair 320; wherein: the first inner photodetector 302 of the first pair 300 is configured to produce an increase in electrical current through its channel member partition; the second outer photodetector 304 of the first pair 300 is configured to produce a decrease in electrical current through its channel member partition; the first inner photodetector 322 of the second pair 320 is configured to produce an decrease in electrical current through its channel member partition; and the second outer photodetector 324 of the second pair 320 is configured to produce an increase in electrical current through its channel member partition.

The apparatus of FIG. 3 comprises at least two pairs 300, 320 of a first inner photodetector 320, 322 and a second outer photodetector 304, 324 arranged to form a full-bridge circuit 350 configured to convert a combined change in electrical current due to detection of electromagnetic radiation by the pixel pair 340 into a differential voltage signal VN 358, VP 362. Light (e.g., visible light, UV light or X-ray radiation) 390 shines onto the first inner and second outer photodetectors 352, 354, 382, 384 of the two pixels 300, 320, and a signal can be read out to indicate the presence and/or magnitude of the detected light 390.

Figure 4A:
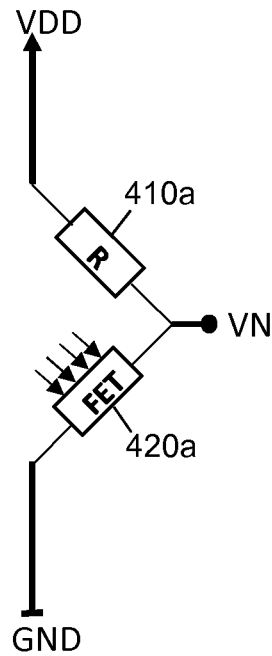
FIGS. 4a-d shows example half bridge and full bridge circuits representing example apparatus.
Figure 4B:
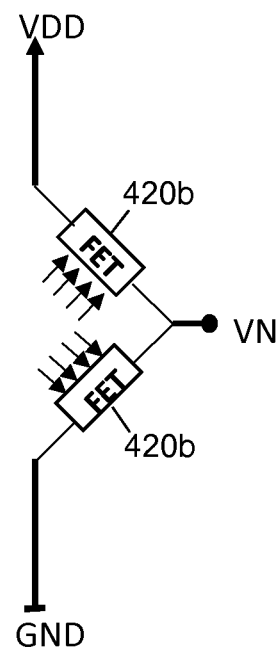
Figure 4C:
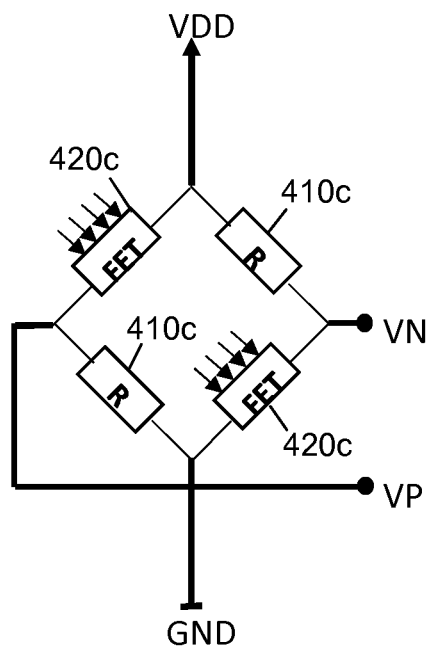
Figure 4D:
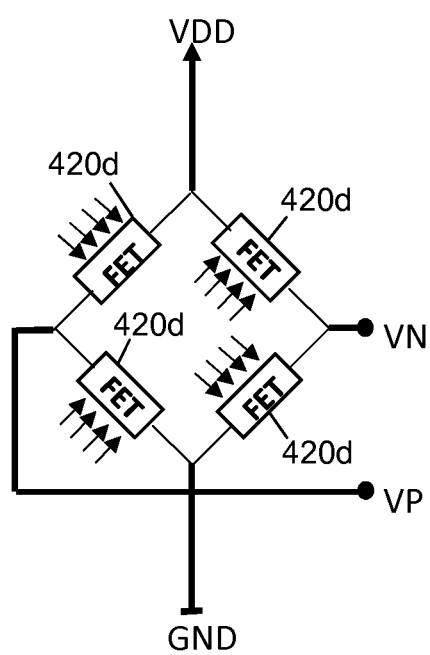

FIGS. 4a-d illustrates example half bridge and full bridge circuits. FIGS. 4a and 4c illustrates half- and full-bridge circuit equivalents which do not employ the pixel geometries described in relation to FIGS. 2 and 3. That is, the circuit equivalents of FIGS. 4a and 4c represent photodetector pixels which do not have a first inner photodetector defined within a second outer photodetector by an intermediate partitioning electrode. FIGS. 4b and 4d illustrate half- and full-bridge circuit equivalents which do employ pixel geometries as described in relation to FIGS. 2 and 3. That is, the circuit equivalents of FIGS. 4b and 4d represent photodetector pixels which comprise a first inner photodetector located within a second outer photodetector as described above.

The half bridge circuits of FIGS. 4a and 4b can provide single output signals. The full bridge circuits of FIGS. 4c and 4d can provide differential output signals. Using pixel geometries as described herein having a first inner and second outer photodetector, represented by FIGS. 4b and 4d, it can be seen that all two (in a half-bridge) or all four (in a full-bridge) resistive bridge components are active photodetectors 420b, 420d. In the circuits of FIGS. 4a and 4c, half the resistive bridge components are not active photodetectors but are simply resistors 410a, 410c. Thus using pixel geometries as described herein allows for more efficient use of sensing area of photodetector arrays. Only active components (photodetectors) 420b, 420d are used in the circuits of FIGS. 4b and 4d and no sensing area is wasted for passive components such as resistors 410a, 410c as in the circuits of FIGS. 4a and 4c.

Figure 5:
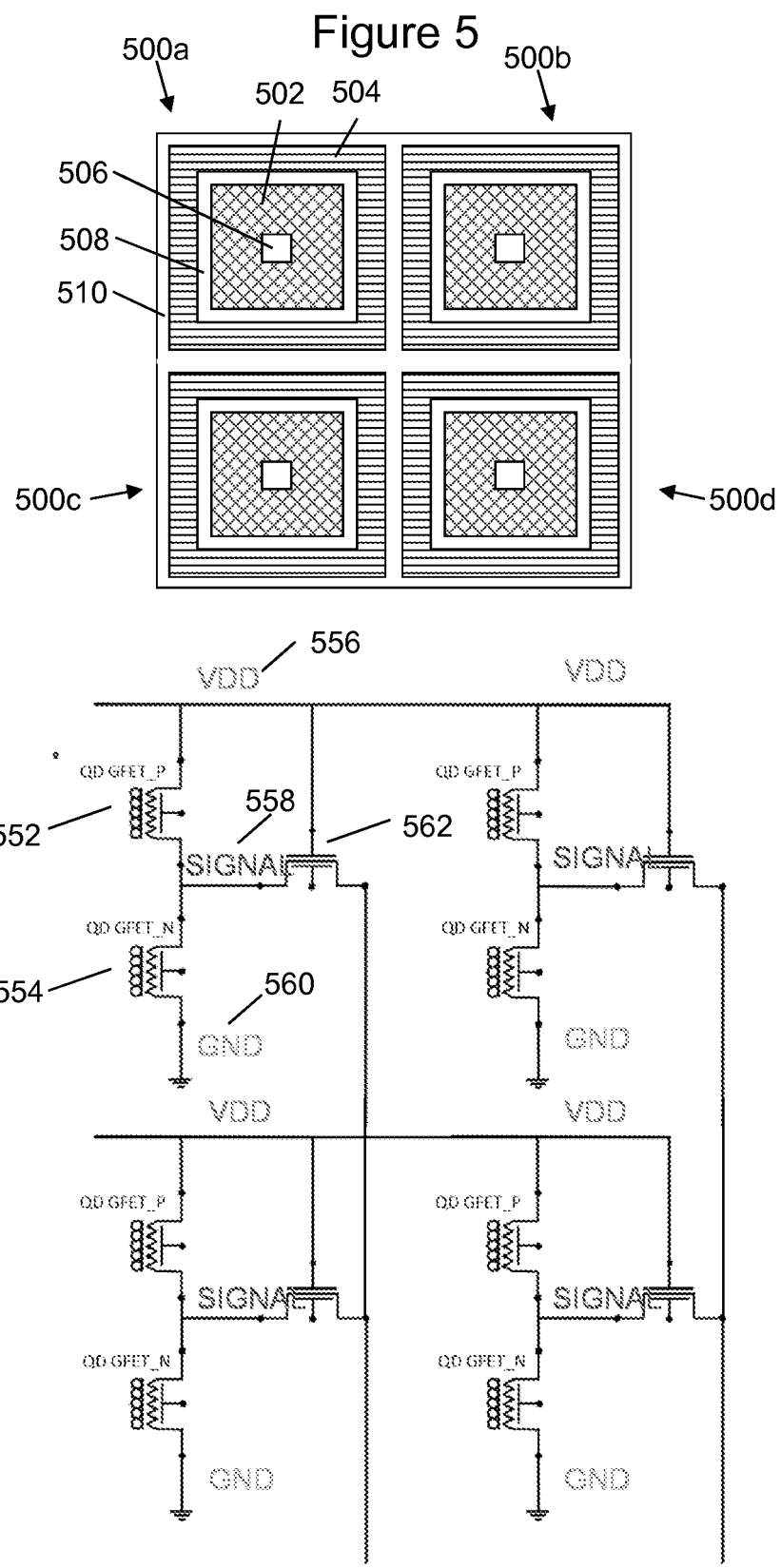
FIG. 5 shows an array of four examples of the present apparatus and an equivalent circuit diagram.

FIG. 5 illustrates an example of four apparatus 500a-d arranged in a 2×2 grid with the outer electrodes 510 of each apparatus 500a-d in common electrical contact and configured to provide a connection to ground 560 for the pixel array. In this example each of the four apparatus 500a-d are identical. In this example the first inner photodetectors 502, 552 of each of the pixels 500a-d may each be positively biased; and the second outer photodetector 504, 554 of each of the pixels 500a-d may each be negatively biased. The circuit diagram of FIG. 5 illustrates that the inner electrode 502 of each pixel 500a-d provides a connection to a supply voltage VDD 556 and the intermediate electrodes 504 of each pixel 500a-d provide a SIGNAL output 558 connection through a voltage amplifier or a switch 562 (the 562 includes at least switch functionality but in many cases, at least if many pixels are connected to one output signal line, 562 can include also amplification). The photodetectors 502, 504 are labelled on the circuit equivalent as QDGFET_P 552 and QD GFET_N 554 because the photodetectors may be realised as positive and negatively biased quantum dot graphene field effect transistors in some examples.

Figure 6:
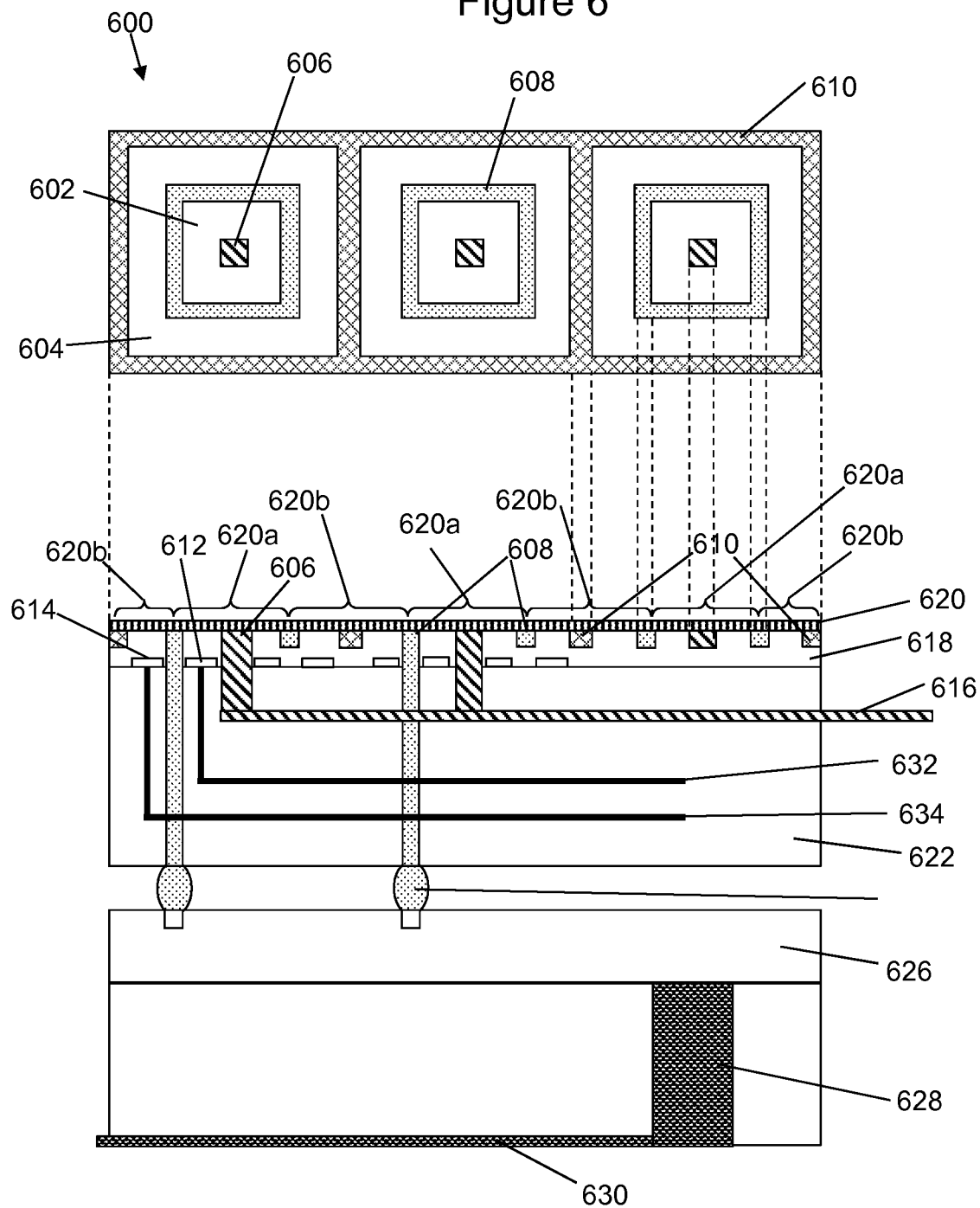
FIG. 6 shows an array of three examples of the present apparatus in top view and in cross section.

FIG. 6 illustrates a cross sectional view of an array of three apparatus/pixels 600 as described above. As before, each apparatus/pixel 600 comprises a first inner photodetector 602 and second outer photodetector 604 in a photodetector pair. Each apparatus/pixel 600 comprises an inner electrode 606 configured to provide a connection to a power supply; an outer electrode 610 located around the periphery of the second outer photodetector 604 and configured to provide a connection between the second outer photodetector 204 and ground; and an intermediate electrode 608 acting as a partitioning electrode to separate the common channel layer 620 which overlies the whole apparatus/pixel 600 into a first inner photodetector channel layer partition of the first inner photodetector 602 and a second outer photodetector channel layer of the second outer photodetector 604. The partitioning electrode 608 is configured to provide a connection for a signal to be read out from each pixel 600.

In this example as seen in the cross-sectional view, the common channel member 620a partition associated with the first inner photodetector 602 is coplanar with the common channel member partition 620b associated with the second outer photodetector 604. In this example the first inner photodetector 602 and second outer photodetector 604 themselves are coplanar (in that their respective electrodes 606, 608, 610 and common channel layer partitions 620a, 620b are coplanar with the equivalent structures in different pixels 600).

Also shown in FIG. 6 are a back gate electrode 612 configured to generate an electric field upon application of a voltage thereto; and regulate the conductivity of the first inner photodetector 602, an electrical connection 632 between the back gate electrode 612 and an external contact; a back gate electrode 614 configured to generate an electric field upon application of a voltage thereto; and regulate the conductivity of the second outer photodetector 604, an electrical connection 634 between the back gate electrode 612 and an external contact, a gate dielectric 618 to electrically separate the different back gates 612, 614 and electrodes 606, 608, 610; and a common electrical connection 616 to the inner electrodes 606 of the pixels 600 for a power supply to be connected thereto. These features in this example are included in a sensor layer 622 of the apparatus 600. Thus in this example, the first inner photodetector 602 and second outer photodetector 604 each comprise a gate electrode 612, 614 configured to generate an electric field upon the application of a voltage thereto, the generated electric field enabling the transfer of either electrons or holes to the channel member partition 620a, 620b of the corresponding photodetector 602, 604, thereby allowing for the conductivity of the corresponding photodetector 602, 604 to be regulated.

FIG. 6 also shows microbumps 624 configured to connect the intermediate partitioning electrodes 608 to a switch layer 626 for signal read-out. The switch later 626 comprises, for example, switches, an analog front-end (AFE), analog-to-digital converter(s) (ADC), and control circuitry. Beneath the switch layer 626 is shown a silicon substrate comprising a through-silicon via (TSV) 628 configured to provide a vertical electrical connection to the switch later 626; and a global interconnection 630 thereto.

Figure 7:
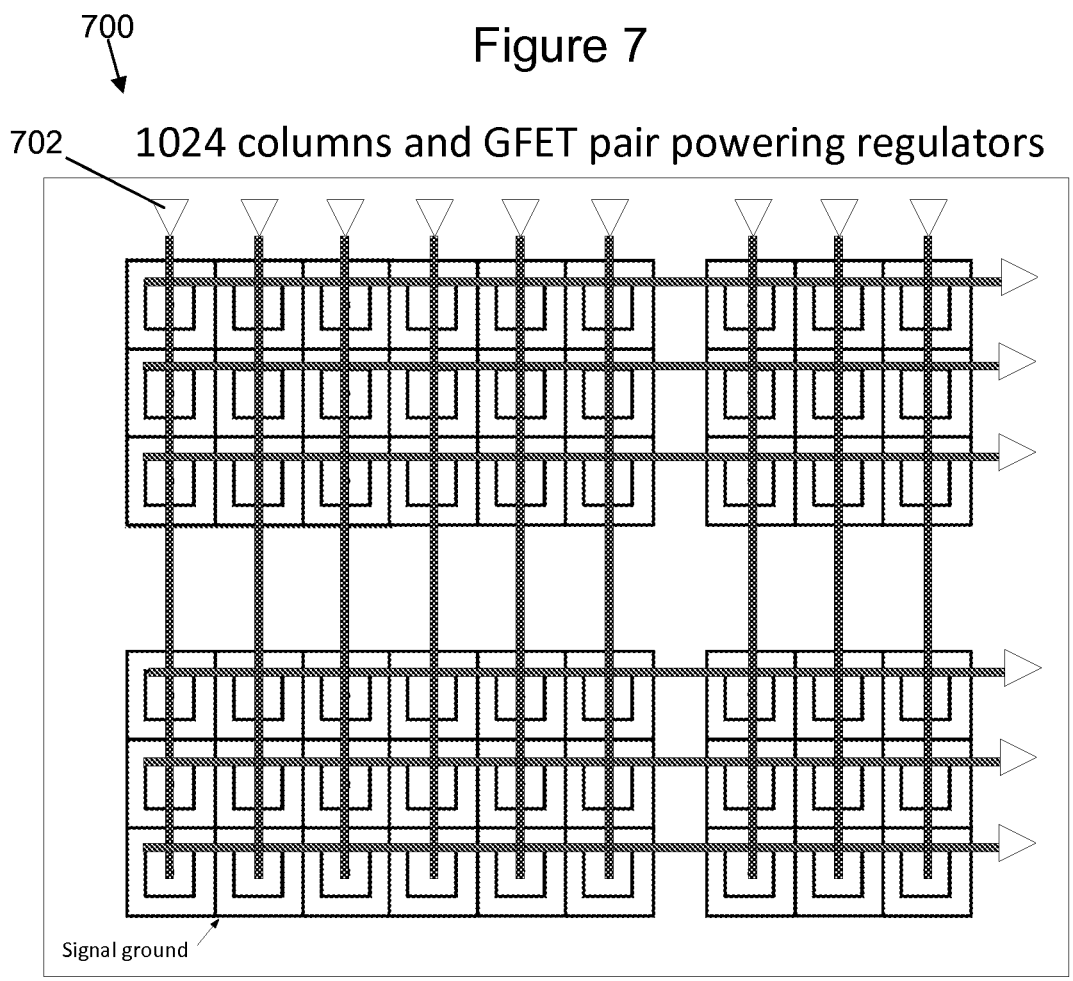
FIG. 7 shows a schematic 1024×1024 array of examples of the present apparatus.

FIG. 7 illustrates an array 700 of 1024×1024 such apparatus 700, all apparatus sharing a common ground due to their electrically connected outer electrodes connected to ground. Each row and column comprises an amplifier 702 to further amplify the signal read out from one of the pixels and filter noise.

Figure 8A:
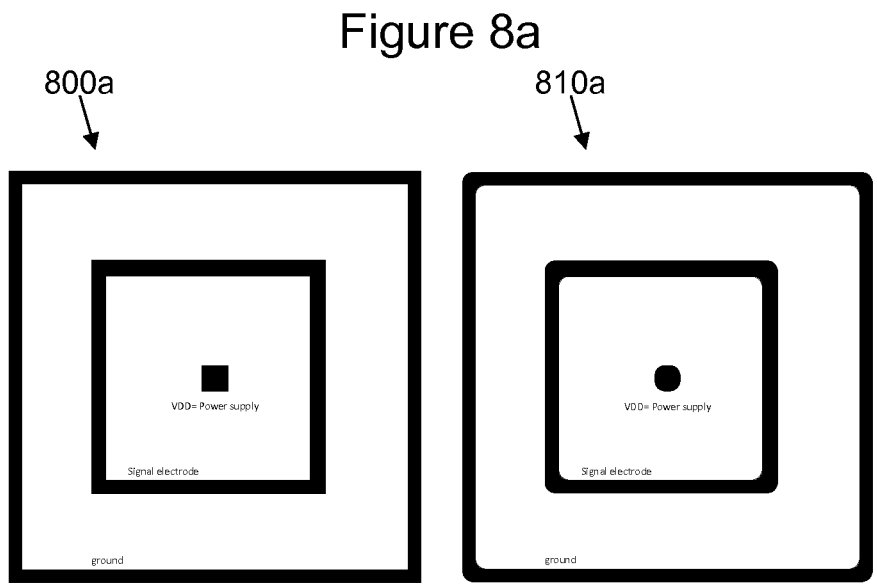
FIG. 8a shows a top-down view of example square geometry apparatuses.
Figure 8B:
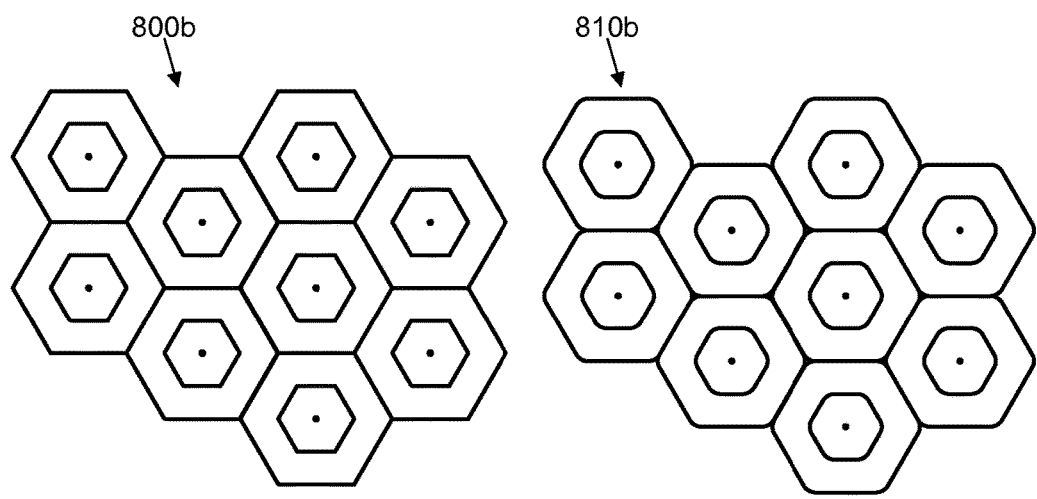
FIG. 8b shows a top-down view of example hexagonal geometry apparatuses.
Figure 8C:
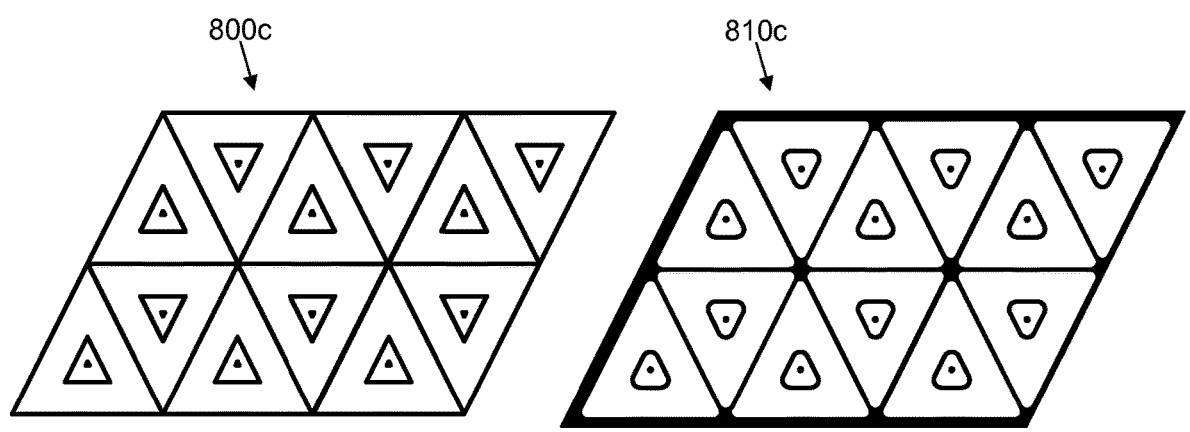
FIG. 8c shows a top-down view of example triangular geometry apparatuses.

FIGS. 8a-8c illustrate different pixel geometries. If all pixels tessellate without leaving spaces between the pixels then the active sensing area is improved compared with having non-active space between the pixels which is not used for sensing (this would occur if the pixels did not tessellate). FIG. 8a shows a square geometry pixel 800a, 810a as shown and described above. Of course rectangular pixels (not shown) would also fully tessellate. The pixel on the left 800a shows square electrodes with sharp corners, whereas the pixel on the right 810a shows square electrodes having rounded corners. FIG. 8b illustrates hexagonal pixels with sharp electrode corners 800b (on the left) and rounded electrode corners 810b (on the right). FIG. 8c illustrates triangular pixels with sharp electrode corners 800c (on the left) and rounded electrode corners 810c (on the right). Corners of the source and/or drain electrodes of the first inner and/or second outer electrodes may be rounded to facilitate current flow in those electrodes. Hexagonal and triangular pixel geometries in particular may be used in optical applications, for example.

Overall, one of photodetector arrays or more examples described herein may allow for more simple manufacturing by, for example: avoiding the need to pattern the overlaying common channel layer; having a common ground connection to all pixels in the array; having a high area efficiency sensing array due to each equivalent circuit component being an active component (i.e. A FET/GFET for example); and having the possibility of individually powering one pixel or a group of particular pixels for signal read-out.

In one or more examples described herein, the common channel member may comprise graphene. Graphene exhibits a relatively high charge carrier mobility which is particularly sensitive to the electric field generated by the gate electrode(s) or photosensitive material (i.e. the quantum dots) of the photodetector(s). In other examples, however, the common channel member may comprise different two-dimensional materials such as a graphene-like material (e.g. graphene oxide, phosphorene, silicone, germanene, stanine, h-BN, AlN, GaN, InN, InP, InAs, BP, BaS or GaP) or a transition metal dichalcogenide (e.g. $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ or $PtX_2$, where X=S, Se or Te). In addition, the source, drain and gate electrodes of at least one photodetector may comprise one or more of a metal, a metal nanoparticle ink, silver, gold, copper, nickel, cobalt, a conductive metal oxide, a carbon-based material, an organic material and a polymer.

There are a number of ways in which the apparatus may be configured such that the first inner and second outer photodetectors produce different changes in electrical current. The first inner photodetector and second outer photodetector of the photodetector pair may comprise similarly doped channel members. The voltage applied to a gate electrode of the first inner photodetector may have an opposite polarity to the voltage applied to a gate electrode of the second outer photodetector such that the resulting electric fields enable the transfer of different types of charge carrier to the respective channel members in order to produce different changes in electrical current.

The first inner photodetector and second outer photodetector of the photodetector pair may comprise oppositely doped channel members. The voltage applied to a gate electrode of the first inner photodetector may have the same polarity as the voltage applied to a gate electrode of the second outer photodetector such that the resulting electric fields enable the transfer of the same type of charge carrier to the respective channel members in order to produce the different changes in electrical current.

Figures 9, 10:
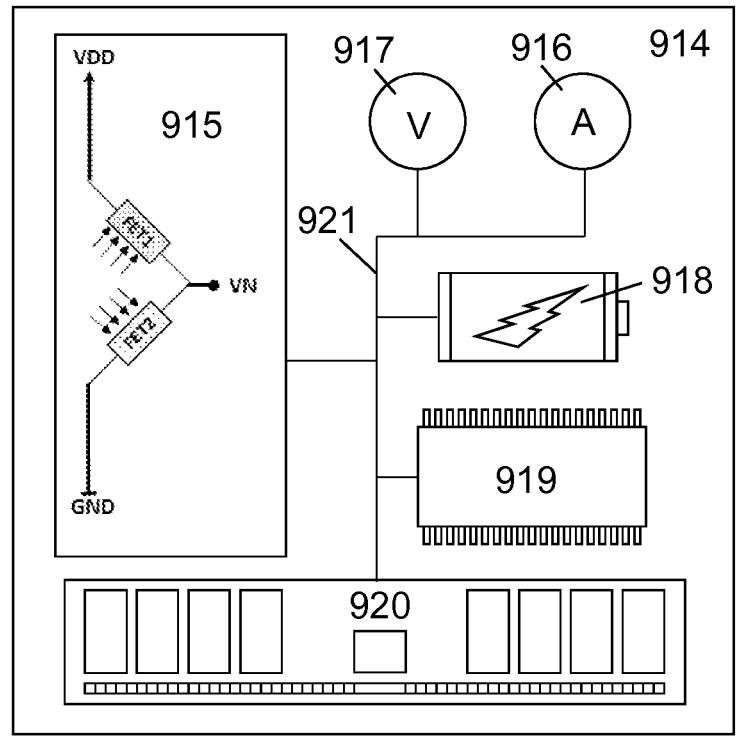
FIG. 9 shows another example of the present apparatus.
FIG. 10 shows a method of using the present apparatus.

FIG. 9 shows another example of the present apparatus 914. The apparatus 914 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an electromagnetic radiation sensor, an x-ray sensor, and a module for one or more of the same. In the example shown, the apparatus 914 comprises various components as described previously (denoted collectively by reference numeral 915), an ammeter 916, a voltmeter 917, a power supply 918, a processor 919 and a storage medium 920, which are electrically connected to one another by a data bus 921.

The processor 919 is configured for general operation of the apparatus 914 by providing signalling to, and receiving signalling from, the other components to manage their operation. The storage medium 920 is configured to store computer code configured to perform, control or enable operation of the apparatus 914. The storage medium 920 may also be configured to store settings for the other components. The processor 919 may access the storage medium 920 to retrieve the component settings in order to manage the operation of the other components.

Under the control of the processor 919, the power supply 918 is configured to apply a voltage between the source and drain electrodes of each photodetector to enable a flow of electrical current through the respective channel member partition. In addition, the power supply 918 may be configured to apply a further voltage to the gate electrode to control the transfer of charge carriers between the quantum dots and channel member partition for a particular photodetector.

The ammeter 916 is configured to measure the electrical current through the channel member partitions of the respective photodetectors so that any changes in current caused by the incident electromagnetic radiation can be determined. Additionally or alternatively, the voltmeter 917 is configured to measure the voltage signal corresponding to the combined change in electrical current.

Based on the combined change in electrical current of the first and second photodetectors, or the corresponding voltage signal, the processor 919 is configured to determine one or more of the presence and magnitude of the incident electromagnetic radiation. In order to determine the presence/magnitude of the incident electromagnetic radiation, the processor 919 may use predetermined calibration data saved in the storage medium 920 which correlates the intensity of the electromagnetic radiation with the combined change in current or the corresponding voltage signal.

The processor 919 may be a microprocessor, including an Application Specific Integrated Circuit (ASIC). The storage medium 920 may be a temporary storage medium such as a volatile random access memory. On the other hand, the storage medium 920 may be a permanent storage medium such as a hard disk drive, a flash memory, or a non-volatile random access memory. The power supply 918 may comprise one or more of a primary battery, a secondary battery, a capacitor, a supercapacitor and a battery-capacitor hybrid.

FIG. 10 shows schematically the main step 1000 of a method of using the present apparatus. The method generally comprises determining one or more of the presence and magnitude of electromagnetic radiation incident upon the apparatus based on the combined change in electrical current of the pair of first inner and second outer photodetectors as a result of the incident electromagnetic radiation.

FIG. 11 shows schematically the main step 1100 of a method of making the present apparatus. The method generally comprises: configuring the apparatus such that the first inner photodetector and second outer photodetector of the photodetector pair generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation.

FIG. 12 illustrates schematically a computer/processor readable medium 1200 providing a computer program according to one example. The computer program may comprise computer code configured to perform, control or enable one or more of the method steps 1000 and/or 1100 of FIG. 10 or 11. In this example, the computer/processor readable medium 1200 is a disc such as a digital versatile disc (DVD) or a compact disc (CD). In other examples, the computer/processor readable medium 1200 may be any medium that has been programmed in such a way as to carry out an inventive function. The computer/processor readable medium 1200 may be a removable memory device such as a memory stick or memory card (SD, mini SD, micro SD or nano SD).

Other examples depicted in the figures have been provided with reference numerals that correspond to similar features of earlier described examples. For example, feature number 1 can also correspond to numbers 101, 201, 301 etc. These numbered features may appear in the figures but may not have been directly referred to within the description of these particular examples. These have still been provided in the figures to aid understanding of the further examples, particularly in relation to the features of similar earlier described examples.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to different examples thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or example may be incorporated in any other disclosed or described or suggested form or example as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising at least one pair of a first inner photodetector and a second outer photodetector,
   each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;
   the first inner photodetector and second outer photodetector of the photodetector pair configured to generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation;
   the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector.

2. The apparatus of claim 1, wherein the respective partitioning electrodes are configured such that:
   the drain electrode of the first inner photodetector acts as the source electrode of the second outer photodetector; or
   the drain electrode of the first inner photodetector is electrically connected to the source electrode of the second outer photodetector.

3. The apparatus of claim 1, wherein the common channel member partition associated with the first inner photodetector is coplanar with the common channel member partition associated with the second outer photodetector.

4. The apparatus of claim 1, wherein the first inner photodetector and second outer photodetector are coplanar.

5. The apparatus of claim 1, wherein the common channel member comprises graphene.

6. The apparatus of claim 1, wherein the first inner photodetector comprises an inner source electrode configured to provide a connection to a power supply; the power supply, when connected, configured to power the first inner photodetector and second outer photodetector.

7. The apparatus of claim 6, wherein the inner source electrode is located substantially centrally within the first inner photodetector.

8. The apparatus of claim 1, wherein the second outer photodetector comprises a drain electrode located around the periphery of the second outer photodetector in two dimensions; the drain electrode of the second outer photodetector configured to provide a connection between the second outer photodetector and ground.

9. The apparatus of claim 1, wherein the first inner photodetector and second outer photodetector each comprise a gate electrode configured to generate an electric field upon the application of a voltage thereto, the generated electric field enabling the transfer of either electrons or holes to the channel member partition of the corresponding photodetector, thereby allowing for the conductivity of the corresponding photodetector to be regulated.

10. The apparatus of claim 1, wherein the first inner photodetector and second outer photodetector of the photodetector pair are arranged to form a half-bridge circuit configured to convert the combined change in electrical current into a single-ended voltage signal.

11. The apparatus of claim 1 wherein the apparatus comprises at least two pairs of first inner photodetector and second outer photodetector arranged to form a full-bridge circuit configured to convert the combined change in electrical current into a differential voltage signal.

12. The apparatus of claim 1 further comprising at least a first pair of a first inner photodetector and a second outer photodetector and a second pair of a first inner photodetector and a second outer photodetector, the first pair being adjacent to the second pair; wherein:
   the first inner photodetector of the first pair is configured to produce an increase in electrical current through its channel member partition;
   the second outer photodetector of the first pair is configured to produce an decrease in electrical current through its channel member partition;
   the first inner photodetector of the second pair is configured to produce an decrease in electrical current through its channel member partition; and
   the second outer photodetector of the second pair is configured to produce an increase in electrical current through its channel member partition.

13. The apparatus of claim 1, wherein the first inner photodetector and second outer photodetector together form a pixel; and wherein the pixel shape is: square, rectangular, triangular, or hexagonal.

14. A method of using an apparatus,
   the apparatus comprising at least one pair of a first inner photodetector and a second outer photodetector,
   each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member;
   the first inner photodetector and second outer photodetector of the photodetector pair configured to generate electron-hole pairs which produce an increase and decrease in electrical current through the channel members respectively, the combined change in electrical current of the pair of first inner photodetector and second outer photodetector being indicative of one or more of the presence and magnitude of the incident electromagnetic radiation;
   the first inner photodetector and the second outer photodetector sharing a common channel member, the common channel member partitioned by use of one or more of the respective source and drain electrodes which act as respective partitioning electrodes by respectively extending in two dimensions such that the first inner photodetector is defined within the second outer photodetector;

the method comprising determining one or more of the presence and magnitude of electromagnetic radiation incident upon the apparatus based on the combined change in electrical current of the pair of first inner and second outer photodetectors as a result of the incident electromagnetic radiation.

15. The method of claim 14, wherein the common channel member partition associated with the first inner photodetector is coplanar with the common channel member partition associated with the second outer photodetector.

16. The method of claim 14, wherein the first inner photodetector and second outer photodetector are coplanar.

17. The method of claim 14, wherein the common channel member comprises graphene.

18. The method of claim 14, wherein the first inner photodetector comprises an inner source electrode configured to provide a connection to a power supply; the power supply, when connected, configured to power the first inner photodetector and second outer photodetector.

19. The method of claim 18, wherein the inner source electrode is located substantially centrally within the first inner photodetector.

* * * * *